(12) United States Patent
Kuribayashi et al.

(10) Patent No.: US 11,784,067 B2
(45) Date of Patent: Oct. 10, 2023

(54) HOLDING DEVICE AND METHOD FOR MANUFACTURING HOLDING DEVICE

(71) Applicant: NGK SPARK PLUG CO., LTD., Nagoya (JP)

(72) Inventors: Makoto Kuribayashi, Nagoya (JP); Masahiro Inoue, Nagoya (JP); Toshimasa Sakakibara, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 401 days.

(21) Appl. No.: 17/052,349

(22) PCT Filed: Jan. 8, 2019

(86) PCT No.: PCT/JP2019/000153
§ 371 (c)(1),
(2) Date: Nov. 2, 2020

(87) PCT Pub. No.: WO2019/230030
PCT Pub. Date: Dec. 5, 2019

(65) Prior Publication Data
US 2021/0233785 A1    Jul. 29, 2021

(30) Foreign Application Priority Data
May 28, 2018    (JP) .................................. 2018-101623

(51) Int. Cl.
*H01L 21/67* (2006.01)
*H05B 3/28* (2006.01)
(Continued)

(52) U.S. Cl.
CPC ........ *H01L 21/67103* (2013.01); *B32B 9/005* (2013.01); *B32B 37/12* (2013.01);
(Continued)

(58) Field of Classification Search
CPC ....... B32B 15/043; B32B 15/08; B32B 15/20; B32B 2250/02; B32B 2250/44;
(Continued)

(56) References Cited

U.S. PATENT DOCUMENTS 5,978,202 A * 11/1999 Wadensweiler .... H01L 21/6833
279/128
2003/0094447 A1   5/2003 Yamaguchi
(Continued)

FOREIGN PATENT DOCUMENTS

JP          8-8246 B2    1/1996
JP        11-162620 A    6/1999
(Continued)

OTHER PUBLICATIONS

International Search Report (PCT/ISA/210) dated Mar. 19, 2019 issued by the International Searching Authority in International Application No. PCT/JP2019/000153.

*Primary Examiner* — Sang Y Paik
(74) *Attorney, Agent, or Firm* — Sughrue Mion, PLLC

(57) ABSTRACT

A holding device includes a ceramic member and a base member joined together via a joining portion. When a second direction is perpendicular to a first direction and a third direction is perpendicular to the first and second directions, the joining portion includes a first joining part which extends through the joining portion in the second direction, as viewed in the first direction, and whose thickness in the first direction is uniform in an arbitrary cross section perpendicular to the second direction and in an arbitrary cross section perpendicular to the third direction, and at least one second joining part which is located between the first joining part and one end of the joining portion in the third direction and whose thickness in the first direction increases from the first joining part side toward the end of (Continued)

the joining portion in an arbitrary cross section perpendicular to the second direction.

8 Claims, 6 Drawing Sheets

(51) Int. Cl.
| | | |
|---|---|---|
| *B32B 9/00* | (2006.01) | |
| *B32B 37/12* | (2006.01) | |
| *B32B 41/00* | (2006.01) | |
| *H01J 37/32* | (2006.01) | |
| *H01L 21/683* | (2006.01) | |
| *H05B 1/02* | (2006.01) | |

(52) U.S. Cl.
CPC ........ *B32B 41/00* (2013.01); *H01J 37/32724* (2013.01); *H01L 21/6833* (2013.01); *H05B 1/0233* (2013.01); *H05B 3/283* (2013.01); *H05B 2203/017* (2013.01)

(58) Field of Classification Search
CPC ........ B32B 2307/302; B32B 2307/554; B32B 2307/732; B32B 2307/75; B32B 2457/00; B32B 3/08; B32B 3/20; B32B 37/12; B32B 41/00; B32B 7/027; B32B 7/12; B32B 9/005; B32B 9/041; B32B 9/045; C04B 2237/16; C04B 2237/343; C04B 2237/366; C04B 37/02; H01J 37/32724; H01L 21/67103; H01L 21/67109; H01L 21/6831; H01L 21/6833; H01L 21/68757; H05B 1/0233; H05B 2203/017; H05B 3/283

USPC ..................................................... 219/444.1
See application file for complete search history.

(56) References Cited

U.S. PATENT DOCUMENTS

| | | |
|---|---|---|
| 2005/0210974 A1 | 9/2005 | Unno et al. |
| 2008/0041312 A1* | 2/2008 | Matsuyama ...... H01J 37/32706 118/728 |
| 2008/0083736 A1 | 4/2008 | Steger et al. |
| 2009/0161286 A1 | 6/2009 | Steger et al. |
| 2013/0321974 A1 | 12/2013 | Kuribayashi |
| 2015/0270149 A1 | 9/2015 | Kuribayashi |
| 2016/0196999 A1* | 7/2016 | Yanoh ................. H01L 21/6831 361/234 |

FOREIGN PATENT DOCUMENTS

| | | |
|---|---|---|
| JP | 2004-220966 A | 8/2004 |
| JP | 3982674 B2 | 9/2007 |
| JP | 4662725 B2 | 3/2011 |
| JP | 4749072 B2 | 8/2011 |
| JP | 4944601 B2 | 6/2012 |
| JP | 5222850 B2 | 6/2013 |
| JP | 2013-247342 A | 12/2013 |
| JP | 5509361 B2 | 6/2014 |
| JP | 5823915 B2 | 11/2015 |
| JP | 2016-1757 A | 1/2016 |
| JP | 5891332 B2 | 3/2016 |
| JP | 2016-92481 A | 5/2016 |
| JP | 2016-189428 A | 11/2016 |
| JP | 6215104 B2 | 10/2017 |

* cited by examiner

HOLDING DEVICE AND METHOD FOR MANUFACTURING HOLDING DEVICE

CROSS REFERENCE TO RELATED APPLICATIONS

This application is a National Stage of International Application No. PCT/JP2019/000153, filed Jan. 8, 2019, claiming priority based on Japanese Patent Application No. 2018-101623, filed May 28, 2018.

TECHNICAL FIELD

The technique disclosed in the present specification relates to a holding device.

BACKGROUND ART

An example of a known holding device is an electrostatic chuck which attracts and holds a wafer by means of electrostatic attraction force. The electrostatic chuck includes a ceramic member, a base member, a joining portion joining the ceramic member and the base member together, and a chuck electrode provided in the ceramic member. The electrostatic chuck attracts and holds a wafer on a surface (hereinafter referred to as an "attracting surface") of the ceramic member by utilizing electrostatic attraction force generated as a result of application of a voltage to the chuck electrode.

Since the accuracy of various processes (film formation, etching, etc.) performed on the wafer held on the attracting surface of the electrostatic chuck may degrade unless the temperature of the wafer is maintained at a desired temperature, the electrostatic chuck needs to have the ability to control the temperature distribution of the wafer.

Conventionally, there has been known an electrostatic chuck in which a resin for adjustment whose heat conductivity differs from that of the joining portion is embedded in a surface of the ceramic member opposite the attracting surface at a position determined in accordance with the temperature distribution of the attracting surface (see, for example, Patent Documents 1 and 2).

PRIOR ART DOCUMENTS

Patent Documents

Patent Document 1: Japanese Patent Application Laid-Open (kokai) No. 2016-1757
Patent Document 2: Japanese Patent Application Laid-Open (kokai) No. 2013-247342

SUMMARY OF THE INVENTION

Problem to be Solved by the Invention

In the conventional electrostatic chuck described above in which the resin for adjustment is embedded, a temperature singular point is likely to occur on the attracting surface due to a difference in heat conductivity between a portion of the ceramic member where the resin for adjustment is embedded and another portion of the ceramic member where the resin for adjustment is not embedded. Therefore, the conventional electrostatic chuck has room for further improvement.

Notably, such a problem is a common problem that occurs not only in the electrostatic chuck but also in a holding device (for example, a heating device, a vacuum chuck, or the like) which includes a ceramic member and a base member joined together.

The present specification discloses a technique capable of solving the above-described problem.

Means for Solving the Problems

The technique disclosed in the present specification can be embodied, for example, in the following modes.

(1) A holding device disclosed in the present specification comprises: a ceramic member having a first surface approximately perpendicular to a first direction and a second surface located opposite the first surface; a base member having a third surface and disposed such that the third surface is located on a side toward the second surface of the ceramic member; and a joining portion disposed between the second surface of the ceramic member and the third surface of the base member and joining the ceramic member and the base member together, the holding device being adapted to hold an object on the first surface of the ceramic member. In the holding device, when a direction approximately perpendicular to the first direction is defined as a second direction and a direction approximately perpendicular to both the first direction and the second direction is defined as a third direction, the joining portion includes: a first joining part extending from one end to the other end of the joining portion in the second direction as viewed in the first direction, the thickness of the first joining part in the first direction being approximately uniform in an arbitrary cross section approximately perpendicular to the second direction and in an arbitrary cross section approximately perpendicular to the third direction, and at least one second joining part located between the first joining part and one end of the joining portion in the third direction, the thickness of the second joining part in the first direction increasing from the first joining part side toward the end of the joining portion in an arbitrary cross section approximately perpendicular to the second direction. In the present holding device, the joining portion includes the first joining part and the second joining part. The first joining part extends from one end to the other end of the joining portion in the second direction as viewed in the first direction, and the thickness of the first joining part in the first direction is approximately uniform in an arbitrary cross section approximately perpendicular to the second direction and in an arbitrary cross section approximately perpendicular to the third direction. Meanwhile, the at least one second joining part is located between the first joining part and one end of the joining portion in the third direction. The thickness of the second joining part in the first direction increases from the first joining part side toward the end of the joining portion in an arbitrary cross section approximately perpendicular to the second direction. Namely, the thickness of the second joining part in the first direction is larger than the thickness of the first joining part in the first direction. Therefore, the amount of heat transfer from the ceramic member to the base member through the second joining part is smaller than the amount of heat transfer from the ceramic member to the base member through the first joining part. As a result, it is possible to increase the temperature of the first surface of the ceramic member on the outer circumferential side of the ceramic member. Also, since the thickness of the second joining part in the first direction increases from the first joining part side toward the end of the joining portion, the first surface of the ceramic member can have a temperature distribution such that the temperature changes mildly on the outer peripheral side of the ceramic member. As a result, it is possible to suppress occurrence of a temperature singular point as compared with, for example, a structure in which the thickness of the joining portion in the first direction increases stepwise. Also, it is possible to suppress occurrence of a temperature singular point, due to catching of an air bubble, at a step formed at a location where the thickness of the joining portion in the first direction increases stepwise.

(2) The above-described holding device may comprise a heater electrode provided in the ceramic member and disposed on an imaginary plane approximately perpendicular to the first direction, and may be configured such that, of the second surface of the ceramic member, a surface part in contact with the second joining part slopes such that the distance between the surface part and the imaginary plane decreases from the first joining part side toward the end of the joining portion in an arbitrary cross section approximately perpendicular to the second direction. In the present holding device, the second joining part is formed through provision of a slope on the second surface of the ceramic member. Therefore, in the present holding device, a portion of the second joining part is disposed to be closer to the heater electrode than is the first joining part, and thus heat more easily moves from the heater electrode to the second joining part. Therefore, as compared with a structure in which the entire second surface of the ceramic member is flat, it is possible to suppress an extreme temperature increase on the outer peripheral side of the ceramic member, by virtue of presence of the second joining part.

(3) The above-described holding device may comprise a heater electrode provided in the ceramic member and disposed on an imaginary plane approximately perpendicular to the first direction, and may be configured such that, of the third surface of the base member, a surface part in contact with the second joining part slopes such that the distance between the surface part and the imaginary plane increases from the first joining part side toward the end of the joining portion in an arbitrary cross section approximately perpendicular to the second direction. In the present holding device, the second joining part is formed through provision of a slope on the third surface of the base member. As a result, in the present holding device, of the third surface of the base member, the portion in contact with the second joining part is disposed to be more remote from the heater electrode than is the portion in contact with the first joining part. Therefore, as compared with a structure in which the entire third surface of the base member is flat, by virtue of presence of the second joining part, it is possible to greatly increase the temperature on the outer peripheral side of the ceramic member. Namely, in the case where the temperature at the temperature singular point becomes considerably low due to characteristics of a production line, a production apparatus, etc., the present holding device is particularly effective.

(4) Another holding device disclosed in the present specification comprises: a ceramic member having a first surface approximately perpendicular to a first direction and a second surface located opposite the first surface; a base member having a third surface and disposed such that the third surface is located on a side toward the second surface of the ceramic member; and a joining portion disposed between the second surface of the ceramic member and the third surface of the base member and joining the ceramic member and the base member together, the holding device being adapted to hold an object on the first surface of the ceramic member. In the holding device, when a direction approximately perpendicular to the first direction is defined as a second direction and a direction approximately perpendicular to both the first direction and the second direction is defined as a third direction, the second surface of the ceramic member includes a flat surface part which extends from one end to the other end of the ceramic member in the second direction as viewed in the first direction and is approximately flat, and at least one sloping surface part which is located between the flat surface part and one end of the ceramic member in the third direction and slopes in relation to the flat surface part. The present holding device can suppress occurrence of a temperature singular point.

(5) A holding device manufacturing method disclosed in the present specification is a method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member. The holding device manufacturing method comprises the steps of: measuring a temperature distribution of the first surface of a provisional joined body formed by joining, via a provisional joining portion, a pre-joining ceramic member which is the ceramic member before being joined via the joining portion and a pre-joining base member which is the base member before being joined via the joining portion; separating from each other the pre-joining ceramic member and the pre-joining base member in the provisional joined body and forming a sloping surface on at least one of the second surface of the pre-joining ceramic member and the third surface of the pre-joining base member in an outer-peripheral-side region determined on the basis of the measured temperature distribution; and joining the pre-joining ceramic member and the pre-joining base member via a joining agent after formation of the sloping surface, whereby the joining portion is formed such that, when a direction approximately perpendicular to the first direction is defined as a second direction and a direction approximately perpendicular to both the first direction and the second direction is defined as a third direction, the joining portion includes: a first joining part extending from one end to the other end of the joining portion in the second direction as viewed in the first direction, the thickness of the first joining part in the first direction being approximately uniform in an arbitrary cross section approximately perpendicular to the second direction and in an arbitrary cross section approximately perpendicular to the third direction, and at least one second joining part located between the first joining part and one end of the joining portion in the third direction, the thickness of the second joining part in the first direction increasing from the first joining part side toward the end of the joining portion in an arbitrary cross section approximately perpendicular to the second direction. The present holding device manufacturing method enables manufacture of the holding device in which occurrence of a low-temperature, temperature singular point is suppressed effectively through formation of a sloping surface in a region determined on the basis of the measured temperature distribution of a completed product composed of the ceramic member and the base member joined together via the joining portion.

(6) Another holding device manufacturing method disclosed in the present specification is a method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member. The holding device manufacturing method comprises the steps of: measuring a temperature distribution of the first surface of a provisional joined body formed by joining, via a provisional joining portion, a pre-joining ceramic member which is the ceramic member before being joined via the joining portion and a pre-joining base member which is the base member before being joined via the joining portion; separating from each other the pre-joining ceramic member and the pre-joining base member in the provisional joined body and forming a sloping surface on at least one of the second surface of the pre-joining ceramic member and the third surface of the pre-joining base member in an outer-peripheral-side region determined on the basis of the measured temperature distribution; and joining the pre-joining ceramic member and the pre-joining base member via a joining agent after formation of the sloping surface, whereby the joining portion is formed such that, when a direction approximately perpendicular to the first direction is defined as a second direction and a direction approximately perpendicular to both the first direction and the second direction is defined as a third direction, the joining portion is contact with both a flat surface part which is a part of the second surface of the ceramic member, extends from one end to the other end of the ceramic member in the second direction as viewed in the first direction, and is approximately flat, and at least one sloping surface part which is another part of the second surface of the ceramic member, is located between the flat surface part and one end of the ceramic member in the third direction, and slopes in relation to the flat surface part. According to the present holding device manufacturing method, it is possible to manufacture a holding device in which occurrence of a temperature singular point is suppressed effectively.

(7) Still another holding device manufacturing method disclosed in the present specification is a method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member. The holding device manufacturing method comprises the steps of: measuring a temperature distribution of the first surface of a pre-joining ceramic member which is the ceramic member before being joined via the joining portion; forming a sloping surface on at least one of the second surface of the pre-joining ceramic member and the third surface of a pre-joining base member which is the base member before being joined via the joining portion such that the sloping surface is formed in an outer-peripheral-side region determined on the basis of the measured temperature distribution; and joining the pre-joining ceramic member and the pre-joining base member via a joining agent after formation of the sloping surface, whereby the joining portion is formed such that, when a direction approximately perpendicular to the first direction is defined as a second direction and a direction approximately perpendicular to both the first direction and the second direction is defined as a third direction, the joining portion includes: a first joining part extending from one end to the other end of the joining portion in the second direction as viewed in the first direction, the thickness of the first joining part in the first direction being approximately uniform in an arbitrary cross section approximately perpendicular to the second direction and in an arbitrary cross section approximately perpendicular to the third direction, and at least one second joining part located between the first joining part and one end of the joining portion in the third direction, the thickness of the second joining part in the first direction increasing from the first joining part side toward the end of the joining portion in an arbitrary cross section approximately perpendicular to the second direction. According to the present holding device manufacturing method, it is possible to manufacture a holding device in which occurrence of a low-temperature, temperature singular point is suppressed effectively, without performing a step of separating the ceramic member and the base member from each other.

(8) Still another holding device manufacturing method disclosed in the present specification is a method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member. The holding device manufacturing method comprises the steps of: measuring a temperature distribution of the first surface of a pre-joining ceramic member which is the ceramic member before being joined via the joining portion; forming a sloping surface on at least one of the second surface of the pre-joining ceramic member and the third surface of a pre-joining base member which is the base member before being joined via the joining portion such that the sloping surface is formed in an outer-peripheral-side region determined on the basis of the measured temperature distribution; and joining the pre-joining ceramic member and the pre-joining base member via a joining agent after formation of the sloping surface, whereby the joining portion is formed such that, when a direction approximately perpendicular to the first direction is defined as a second direction and a direction approximately perpendicular to both the first direction and the second direction is defined as a third direction, the joining portion is contact with both a flat surface part which is a part of the second surface of the ceramic member, extends from one end to the other end of the ceramic member in the second direction as viewed in the first direction, and is approximately flat, and at least one sloping surface part which is another part of the second surface of the ceramic member, is located between the flat surface part and one end of the ceramic member in the third direction, and slopes in relation to the flat surface part. According to the present holding device manufacturing method, it is possible to manufacture a holding device in which occurrence of a temperature singular point is suppressed effectively.

Notably, the technique disclosed in the present specification can be embodied in various forms. For example, the technique can be embodied as an electrostatic chuck, a heater device (e.g., a CVD heater), a vacuum chuck, other holding devices in which a ceramic member and a base member are joined together, and methods for manufacturing these devices.

MODES FOR CARRYING OUT THE INVENTION

A. Embodiment

Figure 1:
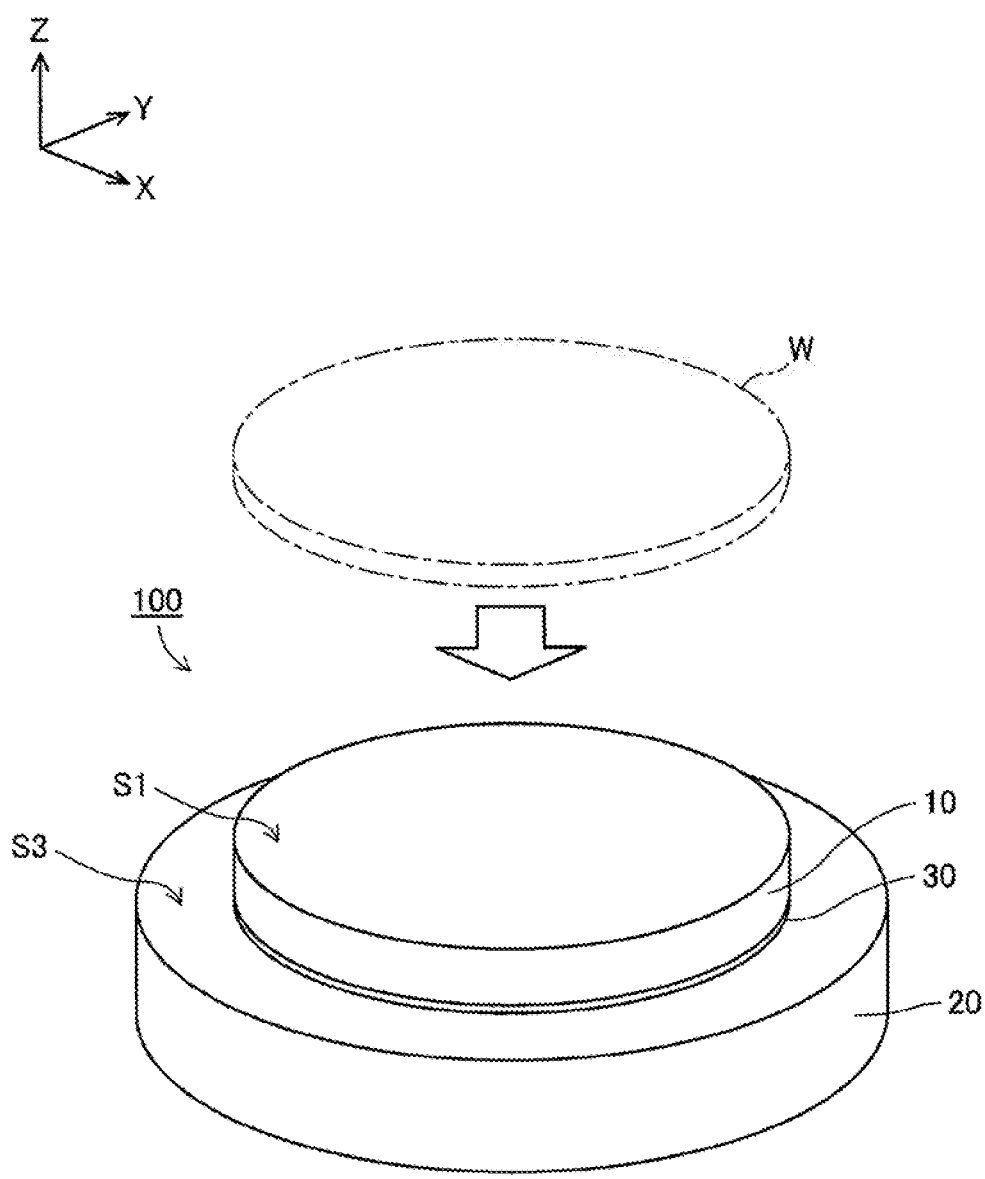
FIG. 1 is a perspective view schematically showing the external structure of an electrostatic chuck 100 in an embodiment.
Figure 2:
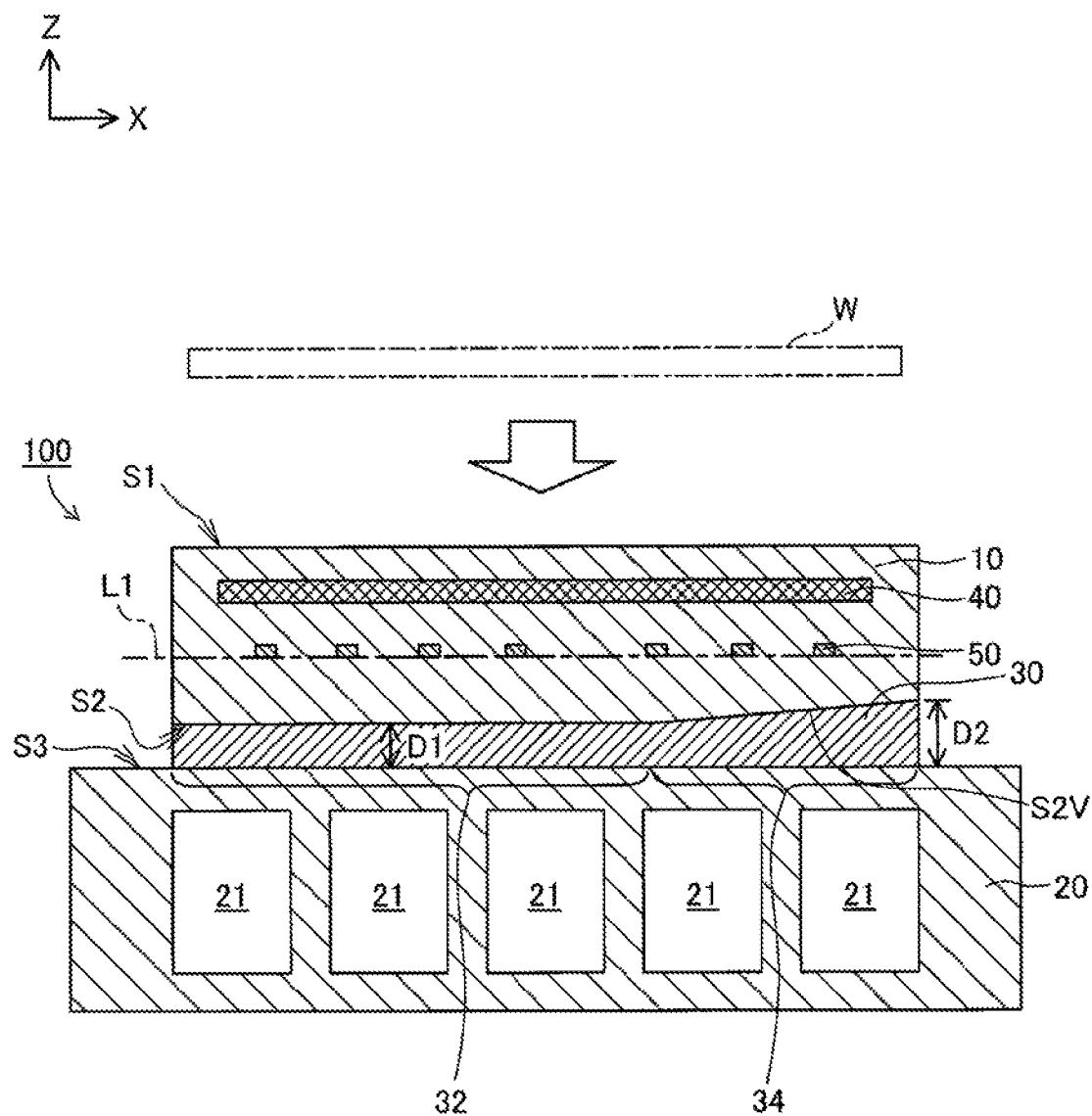
FIG. 2 is an explanatory view schematically showing the XZ cross-sectional structure of the electrostatic chuck 100 in the embodiment.

A-1. Structure of Electrostatic Chuck 100:

FIG. 1 is a perspective view schematically showing the external structure of an electrostatic chuck 100 in the present embodiment, and FIG. 2 is an explanatory view schematically showing the XZ cross-sectional structure of the electrostatic chuck 100 in the present embodiment. Mutually orthogonal X, Y, and Z axes for designating directions are shown in these figures. In the present specification, a positive Z-axis direction is referred to as an upward direction, and a negative Z-axis direction is referred to as a downward direction, for the sake of convenience. However, in actuality, the electrostatic chuck 100 may be disposed with an orientation different from such an orientation.

The electrostatic chuck 100 is a device which attracts and holds an object (e.g., a wafer W) by electrostatic attraction force and is used, for example, to fix the wafer W in a vacuum chamber of a semiconductor manufacturing apparatus. The electrostatic chuck 100 includes a ceramic member 10 and a base member 20 which are arranged in a prescribed arrangement direction (the vertical direction (the Z axis direction) in the present embodiment). The ceramic member 10 and the base member 20 are arranged such that the lower surface of the ceramic member 10 (hereinafter referred to as the "ceramic-side joining surface S2") and the upper surface of the base member 20 (hereinafter referred to as the "base-side joining surface S3") face each other in the arrangement direction and sandwich a joining portion 30, which will be described later. Namely, the base member 20 is disposed such that the base-side joining surface S3 of the base member 20 is located on the side toward the ceramic-side joining surface S2 of the ceramic member 10. The electrostatic chuck 100 further includes the joining portion 30 disposed between the ceramic-side joining surface S2 of the ceramic member 10 and the base-side joining surface S3 of the base member 20. The vertical direction (the Z-axis direction) corresponds to the first direction in the claims; the ceramic-side joining surface S2 corresponds to the second surface in the claims; and the base-side joining surface S3 corresponds to the third surface in the claims.

The ceramic member 10 is a plate-like member having, for example, a circular flat shape and is formed of a ceramic material. The diameter of the ceramic member 10 is, for example, about 50 mm to about 500 mm (generally about 200 mm to about 350 mm), and the thickness of the ceramic member 10 is, for example, about 1 mm to about 10 mm.

Various ceramic materials may be used to form the ceramic member 10. However, from the viewpoint of, for example, strength, wear resistance, and plasma resistance, it is preferred to use a ceramic material which contains aluminum oxide (alumina, $Al_2O_3$) or aluminum nitride (AlN) as a main component. Notably, the term "main component" used herein means a component whose content ratio (weight ratio) is the largest.

A pair of internal electrodes 40 formed of an electrically conductive material (for example, tungsten, molybdenum, or the like) are disposed in the ceramic member 10. When a voltage is applied from a power source (not shown) to the pair of internal electrodes 40, electrostatic attraction force is generated, and the wafer W is attracted and fixed to the upper surface (hereinafter referred to as the "attracting surface S1") of the ceramic member 10 by the electrostatic attraction force. The attracting surface S1 corresponds to the first surface in the claims.

A heater electrode 50 composed of a resistance heating element containing an electrically conductive material (for example, tungsten, molybdenum, or the like) is disposed in the ceramic member 10. When a voltage is applied from a power source (not shown) to the heater electrode 50, the heater electrode 50 generates heat. As a result, the ceramic member 10 is heated, and the wafer W held on the attracting surface S1 of the ceramic member 10 is heated. Thus, control of the temperature of the wafer W is realized. The heater electrode 50 is formed into, for example, an approximately concentric shape as viewed in the Z direction so as to heat the attracting surface S1 of the ceramic member 10 as evenly as possible.

The base member 20 is a plate-like member having, for example, a circular flat shape. The base member 20 has a diameter equal to or larger than the diameter of the ceramic member 10 and is formed of, for example, a material whose heat conductivity is higher than the heat conductivity of the ceramic material used to form the ceramic member 10 (for example, a metal (such as aluminum or an aluminum alloy)). The diameter of the base member 20 is, for example, about 220 mm to about 550 mm (generally about 220 mm to about 350 mm), and the thickness of the base member 20 is, for example, about 20 mm to about 40 mm.

A coolant channel 21 is formed in the base member 20. When a coolant (such as a fluorine-based inert liquid or water) is circulated through the coolant channel 21, the base member 20 is cooled. When the cooling of the base member 20 is performed together with the heating of the ceramic member 10 by the above-described heater electrode 50, the temperature of the wafer W held on the attracting surface S1 of the ceramic member 10 is maintained constant by virtue of heat transfer between the ceramic member 10 and the base member 20 through the bonding portion 30. Further, in the case where heat from plasma enters the electrostatic chuck 100 during a plasma process, the electric power applied to the heater electrode 50 is adjusted, whereby the temperature control of the wafer W is realized.

The bonding portion 30 contains an adhesive such as a silicone-based resin, an acrylic-based resin, or an epoxy-based resin and joins the ceramic member 10 and the base member 20 together. The thickness of the bonding portion 30 is, for example, 0.1 mm to 1 mm. Notably, the structure of the vicinity of a region where the ceramic member 10 and the joining portion 30 are in contact with each other will be described next.

Figure 4:
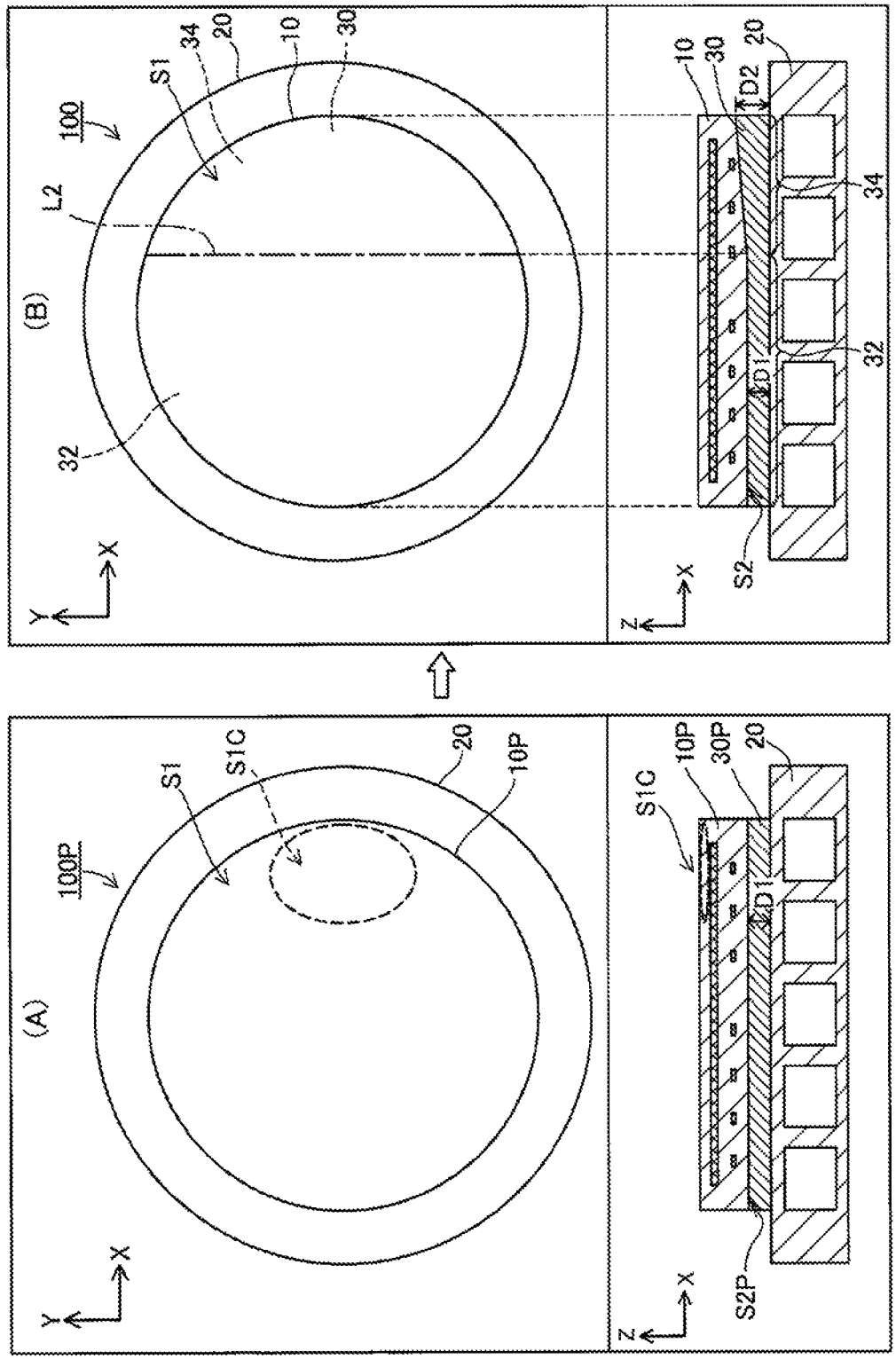
FIG. 4 is a pair of explanatory views showing the temperature distribution and XZ cross-sectional structure of a provisional joined body 100P and the temperature distribution and XZ cross-sectional structure of the electrostatic chuck 100.
Figure 5:
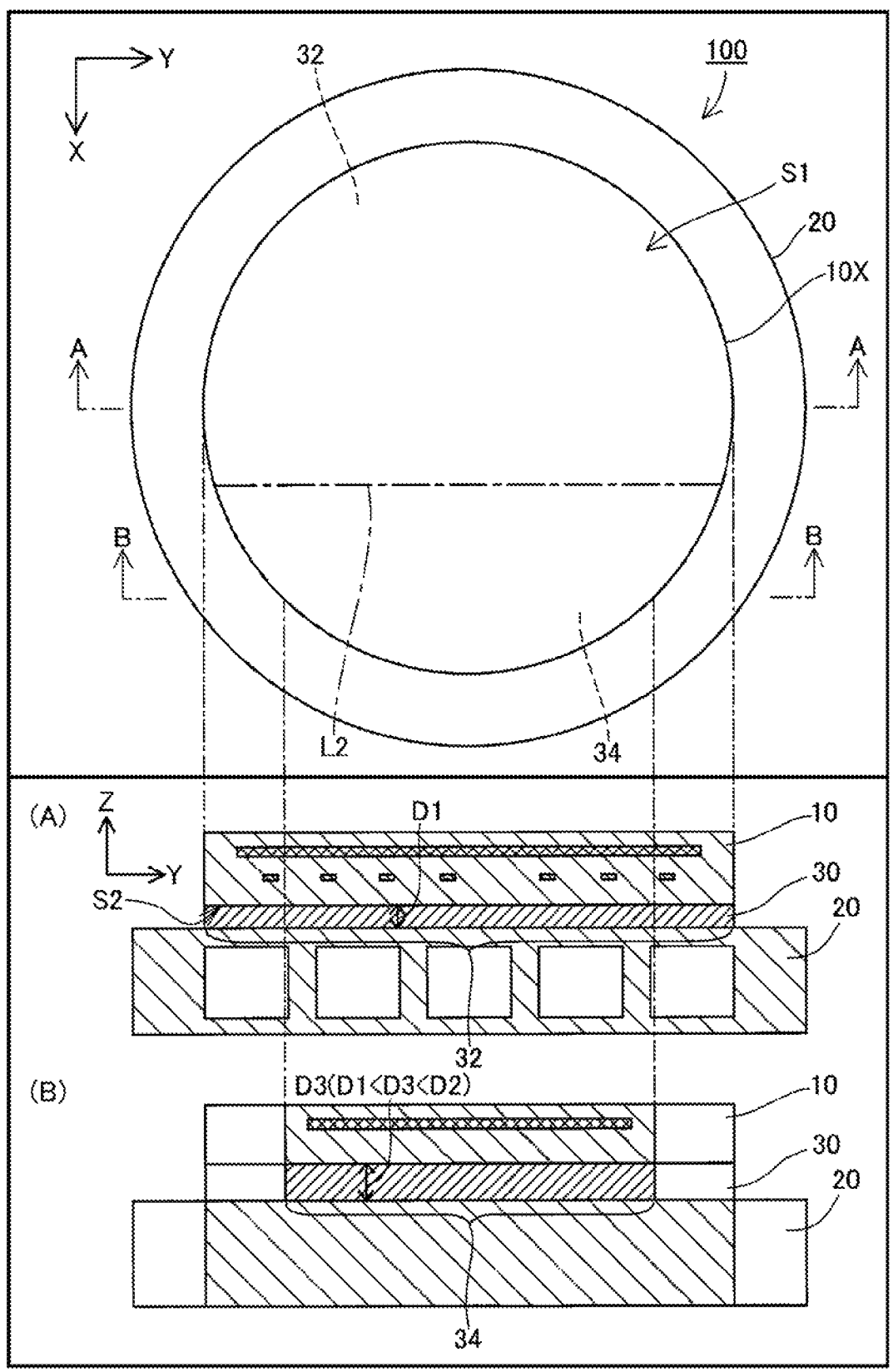
FIG. 5 is an explanatory view showing the temperature distribution and YZ cross-sectional structure of the electrostatic chuck 100.

A-2. Structure of the vicinity of a region where the ceramic member 10 and the joining portion 30 are in contact with each other:

The XY planar structure of the electrostatic chuck 100 in the present embodiment is shown in an upper section of FIG. 4(B) which will be described later, and the XZ cross-sectional structure of the electrostatic chuck 100 in the present embodiment is shown in a lower section of FIG. 4(B). Also, the XY planar structure of the electrostatic chuck 100 is shown in an upper section of FIG. 5 which will be described later, the YZ cross-sectional structure of the electrostatic chuck 100 at the position of line A-A in the upper section of FIG. 5 is shown in a lower section (A) of FIG. 5, and the YZ cross-sectional structure of the electrostatic chuck 100 at the position of line B-B in the upper section of FIG. 5 is shown in a lower section (B) of FIG. 5. Notably, the joining portion 30 is depicted by an imaginary line in the upper section of each drawing. Also, in FIG. 5(B), the coolant channel 21 is omitted. In the present specification, for the sake of convenience, the X-axis direction will be referred to as the left-right direction, and the Y-axis direction will be referred to as the near-far direction. The near-far direction corresponds to the second direction in the claims, and the left-right direction corresponds to the third direction in the claims.

As shown in FIG. 2, FIG. 4(B), and FIG. 5, the joining portion 30 includes a constant thickness part 32 and a thickness varying part 34. As viewed in the vertical direction (the Z-axis direction), the constant thickness part 32 extends from one end to the other end of the joining portion 30 in the near-far direction (the Y-axis direction) (see the upper section of FIG. 4(B) and the upper section of FIG. 5). The constant thickness part 32 is flat and its thickness (D1) in the vertical direction is approximately uniform as a whole. Specifically, in an arbitrary XZ cross section of the joining portion 30 approximately perpendicular to the near-far direction, the thickness (D1) of the constant thickness part 32 in the vertical direction is approximately uniform over the entire length of the constant thickness part 32 in the left-right direction (the X-axis direction) (see FIG. 2 and the lower section of FIG. 4(B)), and the thickness (D1) of the constant thickness part 32 in the vertical direction is approximately uniform among XZ cross sections. Also, in an arbitrary YZ cross section of the joining portion 30 approximately perpendicular to the left-right direction, the thickness (D1) of the constant thickness part 32 in the vertical direction is approximately uniform over the entire length of the constant thickness part 32 in the near-far direction (see FIG. 5(A)), and the thickness (D1) of the constant thickness part 32 in the vertical direction is approximately uniform among YZ cross sections. The thickness (D1) of the constant thickness part 32 in the vertical direction in an arbitrary XZ cross section of the joining portion 30 is approximately the same as the thickness (D1) of the constant thickness part 32 in the vertical direction in an arbitrary YZ cross section of the joining portion 30. Notably, the expression "the thickness of the constant thickness part 32 in the vertical direction is approximately uniform" means that a variation in the thickness of the constant thickness part 32 in the vertical direction is less than ±30 µm. The thickness (D1) of the constant thickness part 32 in the vertical direction is, for example, 100 µm to 1000 µm.

The thickness varying part 34 is located between the constant thickness part 32 and one end of the joining portion 30 in the left-right direction (the X-axis direction) (in FIG. 2 and FIG. 4(B), the thickness varying part 34 is a right-hand part of the joining portion 30). The thickness of the thickness varying part 34 in the vertical direction (the Z-axis direction) increases continuously, as a whole, toward the outer peripheral side of the joining portion 30. Specifically, in an arbitrary XZ cross section of the joining portion 30 approximately perpendicular to the near-far direction (the Y-axis direction), the thickness of the thickness varying part 34 in the vertical direction (the Z-axis direction) increases continuously from the constant thickness part 32 side toward the right end of the joining portion 30. In an arbitrary YZ cross section of the joining portion 30 approximately perpendicular to the left-right direction, the thickness (D3 (D1<D3<D2)) of the thickness varying part 34 in the vertical direction is approximately uniform over the entire length of the thickness varying part 34 in the near-far direction (in the Y-axis direction) (see FIG. 5(B)), and the thickness of the thickness varying part 34 in the vertical direction differs among YZ cross sections. Notably, in the present specification, the term "continuously" means that the thickness varying part 34 does not have a step. Therefore, the term "continuously" encompasses not only the case where the thickness varying part 34 has a straight surface (flat surface), but also the case where the thickness varying part 34 has, for example, a curved surface or a smooth undulation.

More specifically, the constant thickness part 32 and the thickness varying part 34 are located adjacent to each other, and as viewed in the vertical direction (the Z-axis direction), the boundary line L2 between the constant thickness part 32 and the thickness varying part 34 is an approximately straight line approximately parallel to the near-far direction (the Y-axis direction). The constant thickness part 32 is a part of the joining portion 30, which part is surrounded by the boundary line L2 and a left-hand-side portion of the outer circumferential line of the joining portion 30 as viewed in the vertical direction. Namely, as viewed in the vertical direction, the outer edge of the constant thickness part 32, excluding the boundary line L2, reaches the outer circumferential line of the joining portion 30. The thickness varying part 34 is a part of the joining portion 30, which part is surrounded by the boundary line L2 and a right-hand-side portion of the outer circumferential line of the joining portion 30 as viewed in the vertical direction. Namely, as viewed in the vertical direction, the outer edge of the thickness varying part 34, excluding the boundary line L2, reaches the outer circumferential line of the joining portion 30. The thickness (in the vertical direction) of a portion of the thickness varying part 34 located adjacent to the constant thickness part 32 is approximately the same as the thickness (D1) of the constant thickness part 32 in the vertical direction, and the thickness (D2) (in the vertical direction) of a portion of the thickness varying part 34 located furthest from the constant thickness part 32 is greater than the thickness (D1) of the constant thickness part 32 in the vertical direction. Notably, it is not preferred that the difference in thickness in the thickness varying part 34 is excessively small or excessively large. Namely, when the difference in thickness in the thickness varying part 34 is excessively small, the sloping of the thickness varying part 34 may be buried in a variation in the thickness of the joining portion 30 itself in the vertical direction, and the temperature increasing effect by the thickness varying part 34 may not be expected. Meanwhile, when the difference in thickness in the thickness varying part 34 is excessively large, the temperature of the ceramic member 10 on the outer peripheral side may increase excessively, and the strength of the joining portion 30 may decrease due to stress concentration at a specific location. The difference between the thickness (D1) of the thinnest portion of the thickness varying part 34 and the thickness (D2) of the thickest portion of the thickness varying part 34 is preferably 20 µm to 100 µm, more preferably, 30 µm to 60 µm. The length of the thickness varying part 34 in the left-right direction (the X-axis direction) is preferably 10% or more of the entire length of the joining portion 30 in the left-right direction and less than 50% of the entire length. The length of the thickness varying part 34 in the left-right direction is preferably 3 cm or more.

In the present embodiment, the base-side joining surface S3 of the base member 20 is approximately flat as a whole. In contrast, the ceramic-side joining surface S2 of the ceramic member 10 has a flat surface part which is in contact with the constant thickness part 32 of the joining portion 30 and is a flat surface approximately parallel to the base-side joining surface S3 of the base member 20, and a sloping surface part which is in contact with the thickness varying part 34 and is a sloping flat surface sloping such that the distance between the sloping flat surface and the base-side joining surface S3 increases continuously toward the outer peripheral side of the joining portion 30 (the side opposite the flat surface part).

As shown in FIG. 2, as viewed in the vertical direction, at least a portion of the constant thickness part 32 preferably overlaps the heater electrode 50. Also, at least a portion of the thickness varying part 34 preferably overlaps the heater electrode 50. In the present embodiment, the heater electrode 50 is disposed on an imaginary plane L1 approximately parallel to the attracting surface S1. The constant thickness part 32 is disposed such that the distance between the constant thickness part 32 and the heater electrode 50 is approximately constant over the entirety of the constant thickness part 32. Specifically, of the ceramic-side joining surface S2 of the ceramic member 10, a surface part in contact with the constant thickness part 32 is approximately parallel to the imaginary plane L1, on which the heater electrode 50 is formed, in an arbitrary cross section approximately perpendicular to the near-far direction (the Y-axis direction).

Meanwhile, of the ceramic-side joining surface S2, a surface part in contact with the thickness varying part 34 slopes such that the distance between the surface part and the imaginary plane L1 decreases continuously from the constant thickness part 32 side toward the outer peripheral side of the joining portion 30, in an arbitrary cross section approximately perpendicular to the near-far direction (the Y-axis direction). Namely, the thickness varying part 34 is disposed such that the distance between the thickness varying part 34 and the heater electrode 50 decreases continuously from the constant thickness part 32 side toward the outer peripheral side of the joining portion 30. Notably, the constant thickness part 32 corresponds to the first joining part in the claims, and the thickness varying part 34 corresponds to the second joining part in the claims.

Figure 3:
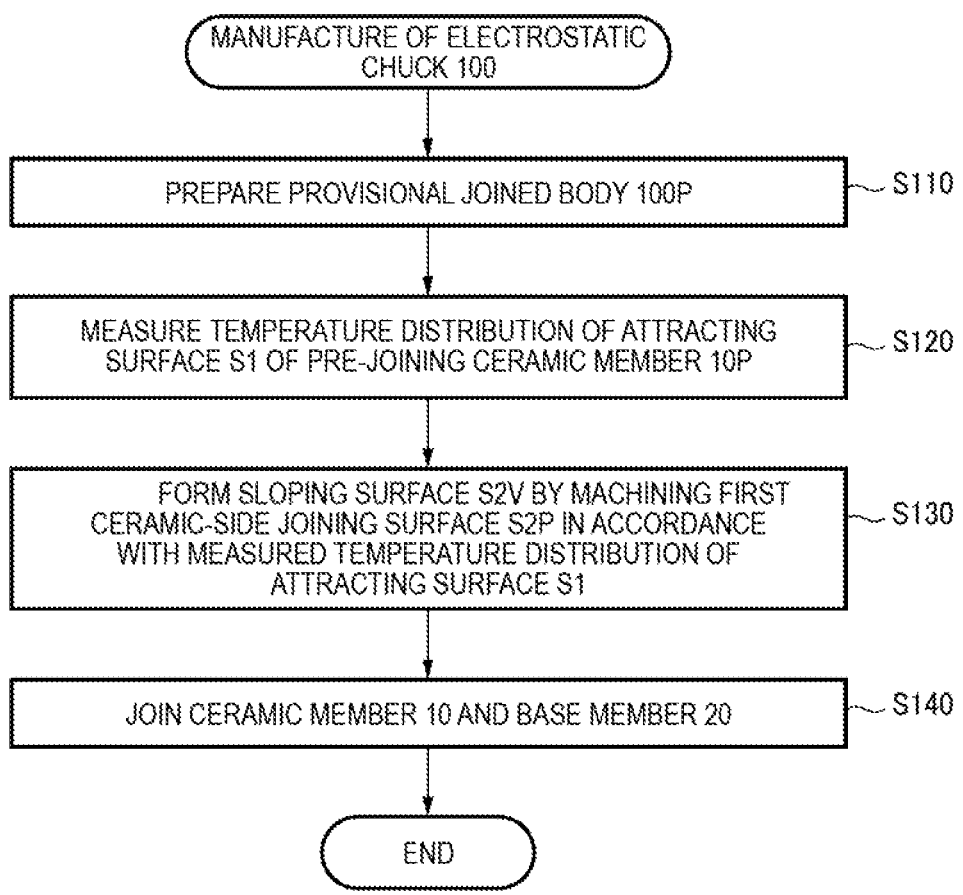
FIG. 3 is a flowchart showing a method for manufacturing the electrostatic chuck 100 in the embodiment.

A-3. Method for Manufacturing the Electrostatic Chuck 100:

FIG. 3 is a flowchart showing a method for manufacturing the electrostatic chuck 100 in the present embodiment. FIG. 4 is a pair of explanatory views showing the temperature distribution and XZ cross-sectional structure of a provisional joined body 100P and the temperature distribution and XZ cross-sectional structure of the electrostatic chuck 100. The XY planar structure of the provisional joined body 100P is shown in an upper section of FIG. 4(A), and the XZ cross-sectional structure of the provisional joined body 100P is shown in a lower section of FIG. 4(A). FIG. 5 is an explanatory view showing the temperature distribution and YZ cross-sectional structure of the electrostatic chuck 100. The provisional joined body 100P corresponds to the provisional joined body in the claims.

(Step of Preparing the Provisional Joined Body 100P):

First, the provisional joined body 100P is prepared (S110). The provisional joined body 100P is a composite formed by joining a pre-joining ceramic member 10P and the base member 20 via a provisional joining portion 30P. The pre-joining ceramic member 10P is the ceramic member 10 before being subjected to machining in a sloping surface forming step (S130) which will be described later. Specifically, the pre-joining ceramic member 10P is the same as the ceramic member 10 except the point that the ceramic-side joining surface S2P on the side opposite the attracting surface S1 is a flat surface approximately parallel to the base-side joining surface S3 of the base member 20, as a whole. The pre-joining ceramic member 10P and the base member 20 can be manufactured by known manufacturing methods. For example, the pre-joining ceramic member 10P is manufactured by the following method. Namely, a plurality of ceramic green sheets (for example, alumna green sheets) are prepared, and processes, such as printing with metallization ink for forming the internal electrodes 40, the heater electrode 50, etc., are performed on the ceramic green sheets. Subsequently, the ceramic green sheets are stacked and are bonded together through thermocompression bonding. The resultant ceramic green laminate is cut into pieces having a predetermined disk-like shape, which are then fired, and polishing or the like is finally performed on the fired pieces, whereby the pre-joining ceramic member 10P is manufactured. Notably, the base member 20 before being joined via the joining portion 30 (the base member 20 in S110 to S130) corresponds to the pre-joining base member in the claims.

(Step of Measuring Temperature Distribution):

Next, for the attracting surface S1 of the pre-joining ceramic member 10P in the provisional joined body 100P, the temperature distribution in a planar direction approximately perpendicular the vertical direction (the Z-axis direction) is measured (S120). It is preferred to measure the temperature distribution of the attracting surface S1 in a state in which the provisional joined body 100P is used. The temperature distribution of the attracting surface S1 is measured, for example, in a state in which electric power is supplied to the internal electrodes 40 and the heater electrode 50 provided in the pre-joining ceramic member 10P and a coolant is supplied to the coolant channel 21 formed in the base member 20. The measurement of the temperature distribution can be performed through use of, for example, an infrared radiation thermometer or a wafer with a thermocouple. As shown in the upper section of FIG. 4(A), the results of the temperature distribution measurement in S120 show that a temperature singular point S1C (temperature singular region) of low temperature is present on the attracting surface S1 of the provisional joined body 100P at a specific location on the outer peripheral side of the pre-joining ceramic member 10P. Such a temperature singular point S1C may appear due to, for example, the characteristics of a production line, a production apparatus, etc. for the electrostatic chuck 100.

(Step of Forming Sloping Surface):

Next, the pre-joining ceramic member 10P and the base member 20 of the provisional joined body 100P are separated from each other, and a sloping flat surface S2V is formed on the ceramic-side joining surface S2P of the pre-joining ceramic member 10P in a region determined on the basis of the temperature distribution of the attracting surface S1 measured in S120 (S130). More specifically, the sloping flat surface S2V is formed on the ceramic-side joining surface S2P on the basis of the temperature distribution of the attracting surface S1 measured in S120 such that the attracting surface S1 has a desired temperature distribution (for example, the temperature becomes approximately uniform in the planar direction). As a result, the ceramic member 10 is completed from the pre-joining ceramic member 10P. The sloping flat surface S2V can be formed relatively simply, for example, by means of polishing or blasting.

(Step of Joining the Ceramic Member 10 and the Base Member 20):

Next, the ceramic member 10 and the base member 20 are joined together (S140). Specifically, the ceramic-side joining surface S2 of the ceramic member 10 and the base-side joining surface S3 of the base member 20 are bonded together with an adhesive (joining agent) disposed therebetween, and in this state, a curing process of curing the adhesive is performed, whereby the joining portion 30 is formed. As a result of performance of the above-described steps, manufacture of the electrostatic chuck 100 having the above-described structure is completed. Thus, as shown in the upper section of FIG. 4(B) and the upper section of FIG. 5, it possible to suppress occurrence of the low-temperature, temperature singular point S1C at a specific location on the outer peripheral side of the ceramic member 10. The above-described manufacturing method enables provision of the electrostatic chuck 100 in which the temperature of a portion of the ceramic member 10 corresponding to the sloping flat surface S2V can be increased through formation of the sloping flat surface S2V in a region determined on the basis of the measured temperature distribution of a completed product composed of the ceramic member 10 and the base member 20 joined together via the joining portion 30.

A-4. Effects of the Present Embodiment:

As described above, in the electrostatic chuck 100 of the present embodiment, the joining portion 30 includes the constant thickness part 32 and the thickness varying part 34 (see FIG. 2, FIG. 4(B), and FIG. 5). The thickness of the constant thickness part 32 in the vertical direction (the Z-axis direction) is approximately uniform as a whole. In contrast, the thickness of the thickness varying part 34 in the vertical direction increases toward the outer peripheral side of the joining portion 30. Namely, the thickness of the thickness varying part 34 in the vertical direction is larger than the thickness of the constant thickness part 32 in the vertical direction. Therefore, the amount of heat transfer from the ceramic member 10 to the base member 20 through the thickness varying part 34 is smaller than the amount of heat transfer from the ceramic member 10 to the base member 20 through the constant thickness part 32. As a result, it is possible to suppress occurrence of the low temperature, temperature singular point S1C on the attracting surface S1 of the ceramic member 10 in a region on the outer peripheral side of the ceramic member 10 (see FIG. 4).

In general, the heat conductivity of the material used to form the joining portion is extremely low as compared with the heat conductivities of the materials used to form the ceramic member and the base member, respectively. Therefore, it is effective to adjust the thickness of the joining portion so as to control the temperature distribution of the attracting surface (the first surface) of the ceramic member. However, a change in the thickness of the joining portion remarkably affects the temperature distribution of the attracting surface even when the change in the thickness is slight. In view of this, the present inventors have newly found a method and a structure for controlling the temperature distribution of the attracting surface while suppressing a local change in the thickness of the joining portion. The method and structure will now be described in detail.

Figure 6:
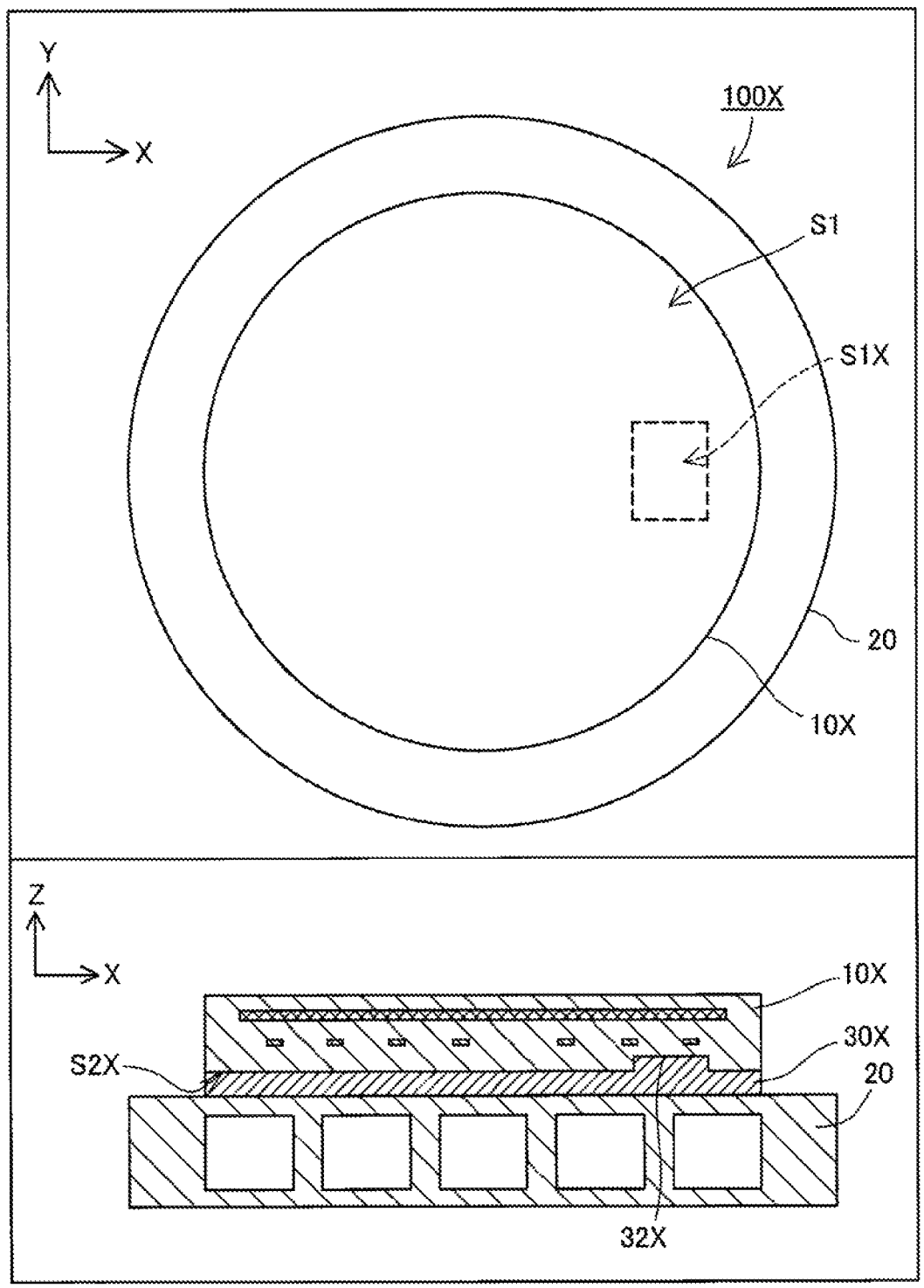
FIG. 6 is an explanatory view showing the temperature distribution and XZ cross-sectional structure of a comparative example 100X.

FIG. 6 is an explanatory view showing the temperature distribution and XZ cross-sectional structure of a comparative example 100X. The XY planar structure of the comparative example 100X is shown in an upper section of FIG. 6, and the XZ cross-sectional structure of the comparative example 100X is shown in a lower section of FIG. 6. The comparative example 100X is a composite formed by joining a ceramic member 10X and the base member 20 via a joining portion 30X. The ceramic member 10X is the same as the pre-joining ceramic member 10P except the point that the ceramic member 10X has a recess 32X formed on a ceramic-side joining surface S2X of the ceramic member 10X. As shown on the upper side of FIG. 6, in the comparative example 100X, the recess 32X formed on the ceramic-side joining surface S2X suppresses occurrence of the low-temperature, temperature singular point S1C on the attracting surface S1 of the ceramic member 10X. However, a step is formed on the ceramic-side joining surface S2X by the recess 32X, and due to this step, the joining portion 30X has a region where its thickness changes greatly and locally. Therefore, as shown in the upper section of FIG. 6, a rectangular temperature singular point S1X may appear in the region where the thickness of the joining portion 30X changes greatly and locally. Also, in the case where a step is present on the ceramic-side joining surface S2X as described above, an air bubble is likely to be caught at the step of the ceramic-side joining surface S2X, for example, when the ceramic member 10X and the base member 20 are joined to each other in S140 of FIG. 3, and the caught air bubble may cause occurrence of the temperature singular point S1X on the attracting surface S1.

In contrast, in the electrostatic chuck 100 of the present embodiment, since the thickness of the thickness varying part 34 in the vertical direction (the Z-axis direction) increases from the constant thickness part 32 side toward the end of the joining portion 30, the attracting surface S1 of the ceramic member 10 has a temperature distribution such that the temperature changes mildly on the outer peripheral side of the ceramic member 10. As a result, it is possible to suppress occurrence of a temperature singular point as compared with the above-described comparative example 100X and a structure in which the thickness of the joining portion in the vertical direction increases stepwise. Also, it is possible to suppress occurrence of a temperature singular point, due to catching of an air bubble, at a step formed at a location where the thickness of the joining portion in the vertical direction increases stepwise.

Also, in the present embodiment, of the ceramic-side joining surface S2, the surface part in contact with the thickness varying part 34 slopes such that the distance between the surface part and the imaginary plane L1 decreases from the constant thickness part 32 side toward the outer peripheral side of the joining portion 30 in an arbitrary cross section approximately perpendicular to the near-far direction (the Y-axis direction). In the present embodiment, since a portion of the thickness varying part 34 is disposed to be closer to the heater electrode 50 than is the constant thickness part 32, heat of the heater electrode 50 more easily moves to the thickness varying part 34. Therefore, as compared with the structure (the provisional joined body 100P) in which the entire ceramic-side joining surface S2 of the ceramic member 10 is flat, it is possible to suppress an extreme change in the temperature distribution on the outer peripheral side of the ceramic member 10, by virtue of presence of the thickness varying part 34.

B. Modifications

The technique disclosed in the present specification is not limited to the embodiment described above and may be modified into various forms without departing from the scope of the invention. For example, the following modifications are possible.

The structure of the electrostatic chuck 100 of the above embodiment is a merely example and can be modified variously. For example, the electrostatic chuck 100 may be configured such that at least one of the heater electrode 50 and the internal electrodes 40 is not provided in the ceramic member 10. This is because controllability of the temperature distribution of the attracting surface S1 may be required in such a configuration. Also, the electrostatic chucks 100 may have a structure in which a metal, a ceramic material, a resin, or the like is disposed between the ceramic member 10 and the base member 20 or a structure in which, separately from the heater electrode 50 disposed in the ceramic member 10, a heater is disposed between the ceramic member 10 and the base member 20.

In the above-described embodiment, the joining portion 30 contains a single thickness varying part 34. However, the joining portion 30 may contain a plurality of thickness varying parts 34. For example, in FIG. 2 and FIG. 4(B), the thickness varying parts 34 may be located between the constant thickness part 32 and opposite ends of the joining portion 30 (on the left and right sides of the joining portion 30) in the left-right direction (the X-axis direction). In this case, as viewed in the vertical direction, the boundary line L2 between one thickness varying part 34 and the constant thickness part 32 and the boundary line L2 between the other thickness varying part 34 and the constant thickness part 32 may be approximately parallel to each other or may not be parallel to each other.

In the above-described embodiment, the constant thickness part 32 is disposed to contain the center of the joining portion 30 in the left-right direction (the X-axis direction). However, the constant thickness part 32 may be disposed not to contain the center of the joining portion 30 in the left-right direction, and the thickness varying part 34 may be disposed to contain the center of the joining portion 30 in the left-right direction.

In the above-described embodiment, the ceramic-side joining surface S2 of the ceramic member 10 may be approximately flat as a whole. In this case, a sloping flat surface is formed on the base-side joining surface S3 of the base member 20. Specifically, the base-side joining surface S3 may have a surface part which is in contact with the first joining part of the joining portion 30 and is a flat surface approximately parallel to the ceramic-side joining surface S2, and a surface part which is in contact with the second joining part of the joining portion 30 and is a sloping flat surface sloping such that the distance between the sloping flat surface and the ceramic-side joining surface S2 increases toward the outer peripheral side of the joining portion 30. Namely, in this structure, the second joining part is formed by imparting sloping to the base-side joining surface S3 of the base member 20. As a result, of the base-side joining surface S3 of the base member 20, the portion in contact with the second joining part is disposed to be more remote from the heater electrode than is the portion in contact with the first joining part. Therefore, as compared with the structure in which the entire base-side joining surface S3 of the base member 20 is flat, it is possible to greatly change the temperature distribution on the outer peripheral side of the ceramic member 10, by virtue of presence of the second joining part. Namely, in the case where the temperature at the temperature singular point becomes considerably low due to characteristics of a production line, a production apparatus, etc., the present configuration is particularly effective.

In the above-described embodiment, portions of the ceramic-side joining surface S2 and the base-side joining surface S3, which portions face each other, may be respective sloping surfaces the distance between which increases toward the outer peripheral side of the joining portion 30. In other words, it is sufficient that, in an arbitrary cross section approximately perpendicular to the second direction, the thickness of the second joining part in the first direction increases from the first joining part side toward the end of the joining portion.

The method for manufacturing the electrostatic chuck 100 in the above embodiment is a mere example and can be modified in various ways. For example, in S130 of FIG. 3, instead of the sloping flat surface S2V, a sloping curved surface may be formed on the ceramic-side joining surface S2P. In other words, the thickness of the thickness varying part 34 (the second joining part) of the joining portion 30 may increase linearly or curvedly from the constant thickness portion 32 (the first joining portion) side toward the outer peripheral side of the joining portion 30.

In the above-described embodiment, the sloping flat surface S2V is formed on the ceramic-side joining surface S2P of the pre-joining ceramic member 10P in a region determined on the basis of the temperature distribution of the attracting surface S1 measured in S120 of FIG. 3 (S130). However, it is possible to form the sloping flat surface S2V on the ceramic-side joining surface S2P without measuring the temperature distribution of the attracting surface S1 of the provisional joined body 100P. For example, in some cases, the position on the attracting surface S1 of the provisional joined body 100P at which the temperature singular point appears can be predicted from the characteristics of the production line, the production apparatus, etc. for the electrostatic chuck 100. In such a case, it is sufficient that the sloping flat surface S2V is formed on the ceramic-side joining surface S2P at a predetermined position determined on the basis of the characteristics of the production line, the production apparatus, etc. without measuring the temperature distribution of the attracting surface S1 of the provisional joined body 100P.

In the above-described embodiment, after measurement of the temperature distribution of the attracting surface S1 of the provisional joined body 100P, the pre-joining ceramic member 10P and the base member 20 are separated from each other, and the sloping flat surface S2V is formed on the pre-joining ceramic member 10P. However, the method for manufacturing the electrostatic chuck 100 is not limited thereto, and the following manufacturing method may be employed. First, the temperature distribution of the attracting surface S1 of the pre-joining ceramic member 10P alone is measured. For example, the heat generation distribution of the heater electrode 50 can be measured, for example, by measuring the temperature distribution of the attracting surface S1 in a state in which electric power is supplied to the heater electrode 50 provided in the pre-joining ceramic member 10P. Subsequently, the sloping flat surface S2V is formed in a region determined on the basis of the measured temperature distribution of the pre-joining ceramic member 10P alone, whereby the ceramic member 10 is completed. At that time, a sloping surface may be formed on the base-side joining surface S3 of the base member 20. After that, the ceramic member 10 and the base member 20 are joined to each other. When such a manufacturing method is employed, the electrostatic chuck 100 can be manufactured without performing the step of separating the pre-joining ceramic member 10P and the base member 20 from each other.

The present invention can be applied not only to the electrostatic chuck 100, which holds the wafer W by using electrostatic attraction force, but also to other holding devices (a vacuum chuck or the like) and manufacturing methods therefor.

DESCRIPTION OF REFERENCE NUMERALS 10, 10X: ceramic member 10P: pre-joining ceramic member 20: base member 21: coolant channel 30, 30X: joining portion 30P: provisional joining portion 32: constant thickness part 32X: recess 34: thickness varying part 40: internal electrode 50: heater electrode 100: electrostatic chuck 100P: provisional joined body D1: thickness L1: imaginary plane L2: boundary line S1: attracting surface S1C: temperature singular point S1X: temperature singular point S2, S2X, S2P: ceramic-side joining surface S2V: sloping flat surface S3: base-side joining surface W: wafer

The invention claimed is:

1. A holding device comprising:
a ceramic member having a first surface approximately perpendicular to a first direction and a second surface located opposite the first surface;
a base member having a third surface and disposed such that the third surface is located on a side toward the second surface of the ceramic member; and
a joining portion disposed between the second surface of the ceramic member and the third surface of the base member and joining the ceramic member and the base member together,
the holding device being adapted to hold an object on the first surface of the ceramic member and being characterized in that
when a direction approximately perpendicular to the first direction is defined as a second direction and a direction approximately perpendicular to both the first direction and the second direction is defined as a third direction,
the joining portion includes:
a first joining part extending from one end to the other end of the joining portion in the second direction as viewed in the first direction, the thickness of the first joining part in the first direction being approximately uniform in an arbitrary cross section approximately perpendicular to the second direction and in an arbitrary cross section approximately perpendicular to the third direction, and
at least one second joining part located between the first joining part and one end of the joining portion in the third direction, the thickness of the second joining part in the first direction increasing from the first joining part side toward the end of the joining portion in an arbitrary cross section approximately perpendicular to the second direction.

2. The holding device according to claim 1, further comprising a heater electrode provided in the ceramic member and disposed on an imaginary plane approximately perpendicular to the first direction, wherein
of the second surface of the ceramic member, a surface part in contact with the second joining part slopes such that the distance between the surface part and the imaginary plane decreases from the first joining part side toward the end of the joining portion in an arbitrary cross section approximately perpendicular to the second direction.

3. The holding device according to claim 1, further comprising a heater electrode provided in the ceramic member and disposed on an imaginary plane approximately perpendicular to the first direction, wherein
of the third surface of the base member, a surface part in contact with the second joining part slopes such that the distance between the surface part and the imaginary plane increases from the first joining part side toward the end of the joining portion in an arbitrary cross section approximately perpendicular to the second direction.

4. A holding device comprising:
a ceramic member having a first surface approximately perpendicular to a first direction and a second surface located opposite the first surface;
a base member having a third surface and disposed such that the third surface is located on a side toward the second surface of the ceramic member; and
a joining portion disposed between the second surface of the ceramic member and the third surface of the base member and joining the ceramic member and the base member together,
the holding device having an area adapted to hold an object on the first surface of the ceramic member and being characterized in that
when a direction approximately perpendicular to the first direction is defined as a second direction and a direction approximately perpendicular to both the first direction and the second direction is defined as a third direction,
the second surface of the ceramic member includes a flat surface part which extends from one end to the other end of the ceramic member in the second direction as viewed in the first direction and is approximately flat, and
at least one sloping surface part which is located (i) underneath the area adapted to hold the object, and (ii) between the flat surface part and one end of the ceramic member in the third direction and slopes in relation to the flat surface part.

5. A method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member,
the method being characterized by comprising the steps of:

measuring a temperature distribution of the first surface of a provisional joined body formed by joining, via a provisional joining portion, a pre joining ceramic member which is the ceramic member before being joined via the joining portion and a pre joining base member which is the base member before being joined via the joining portion;

separating from each other the pre-joining ceramic member and the pre-joining base member in the provisional joined body and forming a sloping surface on at least one of the second surface of the pre joining ceramic member and the third surface of the pre-joining base member in an outer-peripheral-side region determined on the basis of the measured temperature distribution; and joining the pre joining ceramic member and the pre joining base member via a joining agent after formation of the sloping surface, whereby the joining portion is formed such that when a direction approximately perpendicular to the first direction is defined as a second direction and a direction approximately perpendicular to both the first direction and the second direction is defined as a third direction, the joining portion includes:

a first joining part extending from one end to the other end of the joining portion in the second direction as viewed in the first direction, the thickness of the first joining part in the first direction being approximately uniform in an arbitrary cross section approximately perpendicular to the second direction and in an arbitrary cross section approximately perpendicular to the third direction, and at least one second joining part located between the first joining part and one end of the joining portion in the third direction, the thickness of the second joining part in the first direction increasing from the first joining part side toward the end of the joining portion in an arbitrary cross section approximately perpendicular to the second direction.

6. A method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member, the method being characterized by comprising the steps of:

measuring a temperature distribution of the first surface of a provisional joined body formed by joining, via a provisional joining portion, a pre joining ceramic member which is the ceramic member before being joined via the joining portion and a pre joining base member which is the base member before being joined via the joining portion;

separating from each other the pre-joining ceramic member and the pre-joining base member in the provisional joined body and forming a sloping surface on at least one of the second surface of the pre joining ceramic member and the third surface of the pre-joining base member in an outer-peripheral-side region determined on the basis of the measured temperature distribution; and joining the pre joining ceramic member and the pre joining base member via a joining agent after formation of the sloping surface, whereby the joining portion is formed such that when a direction approximately perpendicular to the first direction is defined as a second direction and a direction approximately perpendicular to both the first direction and the second direction is defined as a third direction, the joining portion is contact with both a flat surface part which is a part of the second surface of the ceramic member, extends from one end to the other end of the ceramic member in the second direction as viewed in the first direction, and is approximately flat, and at least one sloping surface part which is another part of the second surface of the ceramic member, is located between the flat surface part and one end of the ceramic member in the third direction, and slopes in relation to the flat surface part.

7. A method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member, the method being characterized by comprising the steps of:

measuring a temperature distribution of the first surface of a pre-joining ceramic member which is the ceramic member before being joined via the joining portion;

forming a sloping surface on at least one of the second surface of the pre joining ceramic member and the third surface of a pre joining base member which is the base member before being joined via the joining portion such that the sloping surface is formed in an outer-peripheral-side region determined on the basis of the measured temperature distribution; and joining the pre joining ceramic member and the pre joining base member via a joining agent after formation of the sloping surface, whereby the joining portion is formed such that when a direction approximately perpendicular to the first direction is defined as a second direction and a direction approximately perpendicular to both the first direction and the second direction is defined as a third direction, the joining portion includes:

a first joining part extending from one end to the other end of the joining portion in the second direction as viewed in the first direction, the thickness of the first joining part in the first direction being approximately uniform in an arbitrary cross section approximately perpendicular to the second direction and in an arbitrary cross section approximately perpendicular to the third direction, and at least one second joining part located between the first joining part and one end of the joining portion in the third direction, the thickness of the second joining part in the first direction increasing from the first joining part side toward the end of the joining portion in an arbitrary cross section approximately perpendicular to the second direction.

8. A method for manufacturing a holding device comprising a ceramic member having a first surface approximately perpendicular to a first direction and a second surface located opposite the first surface, a base member having a third surface and disposed such that the third surface is located on a side toward the second surface of the ceramic member, and a joining portion disposed between the second surface of the ceramic member and the third surface of the base member and joining the ceramic member and the base member together, the holding device holding an object on the first surface of the ceramic member, the method being characterized by comprising the steps of:

measuring a temperature distribution of the first surface of a pre-joining ceramic member which is the ceramic member before being joined via the joining portion;

forming a sloping surface on at least one of the second surface of the pre joining ceramic member and the third surface of a pre joining base member which is the base member before being joined via the joining portion such that the sloping surface is formed in an outer-peripheral-side region determined on the basis of the measured temperature distribution; and joining the pre joining ceramic member and the pre joining base member via a joining agent after formation of the sloping surface, whereby the joining portion is formed such that when a direction approximately perpendicular to the first direction is defined as a second direction and a direction approximately perpendicular to both the first direction and the second direction is defined as a third direction, the joining portion is contact with both a flat surface part which is a part of the second surface of the ceramic member, extends from one end to the other end of the ceramic member in the second direction as viewed in the first direction, and is approximately flat, and at least one sloping surface part which is another part of the second surface of the ceramic member, is located between the flat surface part and one end of the ceramic member in the third direction, and slopes in relation to the flat surface part.

\* \* \* \* \*